(12) United States Patent
Li et al.

(10) Patent No.: US 11,594,260 B2
(45) Date of Patent: Feb. 28, 2023

(54) TOOL-LESS ASSEMBLY HARD DISK DRIVE BRACKET AND ELECTRONIC DEVICE

(71) Applicant: Celestica Technology Consultancy (Shanghai) Co. Ltd, Shanghai (CN)

(72) Inventors: Ting Li, Shanghai (CN); Wenjin Li, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 54 days.

(21) Appl. No.: 16/871,056

(22) Filed: May 11, 2020

(65) Prior Publication Data

US 2021/0193188 A1 Jun. 24, 2021

(51) Int. Cl.
*H05K 5/02* (2006.01)
*G11B 33/04* (2006.01)

(52) U.S. Cl.
CPC ....... *G11B 33/0461* (2013.01); *H05K 5/0204* (2013.01); *H05K 5/0286* (2013.01)

(58) Field of Classification Search
CPC .... H05K 5/003; H05K 5/0052; H05K 5/0286; H05K 5/0204; G11B 33/0461
See application file for complete search history.

(56) References Cited

U.S. PATENT DOCUMENTS

| 9,281,015 | B1* | 3/2016 | Wu | H05K 7/1488 |
|---|---|---|---|---|
| 10,446,186 | B1* | 10/2019 | Mendonsa | G11B 19/28 |
| 11,246,229 | B2* | 2/2022 | Lee | H04M 1/0274 |
| 2015/0327414 | A1* | 11/2015 | Jau | G11B 33/124 |
| | | | | 206/701 |
| 2017/0018293 | A1* | 1/2017 | Chen | G11B 33/124 |
| 2017/0020018 | A1* | 1/2017 | Chen | F16M 13/02 |
| 2020/0090706 | A1* | 3/2020 | Yeh | G11B 33/022 |
| 2020/0143845 | A1* | 5/2020 | Lan | G11B 33/124 |
| 2020/0372938 | A1* | 11/2020 | Wang | G11B 33/128 |
| 2021/0004063 | A1* | 1/2021 | Chen | F16B 2/10 |
| 2021/0256614 | A1* | 8/2021 | Tofte | G06Q 40/08 |

* cited by examiner

*Primary Examiner* — Anthony Q Edwards
*Assistant Examiner* — Keith DePew

(57) ABSTRACT

The present disclosure provides a tool-less assembly hard disk drive bracket, including: a fixation rack, including a fixation bracket portion and a fixation arm connected with a first side of the fixation bracket portion; a rotation rack, including a rotation arm connected with a second side of the fixation bracket portion, and a rotation bracket portion connected with the rotation arm, the rotation bracket portion is connected with the fixation bracket portion to support a hard disk drive; and at least two connecting components, arranged on an inner side of the fixation arm and the rotation arm, respectively, the connecting components connect and fix the hard disk drive in the structure formed by the fixation rack and the rotation rack. The present disclosure is simple in installation, convenient in assembly and disassembly, and easy to maintain, thereby having high economy and practicability.

13 Claims, 7 Drawing Sheets

TOOL-LESS ASSEMBLY HARD DISK DRIVE BRACKET AND ELECTRONIC DEVICE

CROSS REFERENCES TO RELATED APPLICATIONS

This application claims priority of a Chinese Patent Application No. 2019113280696, filed on Dec. 20, 2019, and claims priority of a Chinese Patent Application No. 2019223566445, filed on Dec. 20, 2019, the contents of which are hereby incorporated by reference in their entireties for all purposes.

TECHNICAL FIELD

The disclosure relates to the technical field of electronic devices, in particular, to a tool-less assembly hard disk drive bracket and an electronic device.

BACKGROUND

Generally, the servers are equipped with Hard Disk Drive (HDD). The hard disk drive brackets are always designed with a hot-plug structure. In the existing hard disk drive fixation structure, in order to facilitate the insertion and removal of the hard disk drive, the hard disk drive is usually arranged in a hard disk drive bracket. First, the hard disk drive is fixed to the hard disk drive bracket by a screw, and then the hard disk drive bracket is fixed to the inside of the chassis by a screw. When the hard disk drive needs maintaining, a screwdriver is required to unscrew the screws, which causes the disassembly process to be inconvenient, and time-consuming. Besides, hard disk drive brackets are always made of plastic, which has poor rigidity and is easily aging. When the hard disk drive is inserted and removed for many times, the force on the hard disk drive will be unbalanced, resulting in deforming of the hard disk drive bracket, and damaging the hard disk drive.

SUMMARY

The present disclosure provides a tool-less assembly hard disk drive bracket and an electronic device to solve the problem that it is inconvenient and time-consuming to assemble or disassemble hard disk drive cartridge, and it is easy to damage the hard disk drive when inserting and removing the hard disk drive for many times.

The present disclosure provides a tool-less assembly hard disk drive bracket, including: a fixation rack, a rotation rack, and at least two connecting components. The fixation rack includes a fixation bracket portion and a fixation arm connected with a first side of the fixation bracket portion. The rotation rack includes a rotation arm connected with a second side of the fixation bracket portion, and a rotation bracket portion connected with the rotation arm. The rotation bracket portion is connected with the fixation bracket portion, and the rotation bracket portion and fixation bracket portion support a hard disk drive. At least two connecting components are arranged on an inner side of the fixation arm and an inner side of the rotation arm, respectively. The connecting components connect and fix the hard disk drive in the structure formed by the fixation rack and the rotation rack.

In an embodiment of the present disclosure, the rotation arm and the rotation bracket portion are integrally formed.

In an embodiment of the disclosure, the rotation bracket portion and the fixation bracket portion are engaged with or disengaged from each other through a snap structure.

In an embodiment of the present disclosure, the rotation bracket portion is connected with the fixation bracket portion to form a rectangle matching the bottom of the hard disk drive; the rotation bracket part and the fixation bracket part include a heat dissipation hole or a hollow structure with a preset pattern.

In an embodiment of the present disclosure, the rotation bracket portion includes a longitudinal rotation bracket portion parallel to the rotation arm, and a lateral rotation bracket portion vertical to the longitudinal rotation bracket portion.

In an embodiment of the present disclosure, a top end of the longitudinal rotation bracket portion is connected with the fixation rack through a rotation shaft, so that the rotation bracket portion is capable of rotating relative to the fixation rack, and driving the rotation arm to rotate.

In an embodiment of the present disclosure, a top end of the lateral rotation bracket portion is engaged with or disengaged from the fixation arm through a snap structure.

In an embodiment of the present disclosure, the fixation arm includes at least one indentation, and the snap structure of the lateral rotation bracket portion matches the indentation, so that the lateral rotation bracket portion is engaged with or disengaged from the fixation arm.

In an embodiment of the present disclosure, the connecting component includes a clamping post, the clamping post matches a connecting hole of the hard disk drive to fix the hard disk drive.

In an embodiment of the present disclosure, the fixation arm contains a fool-proofing block; the fool-proofing block matches the hard disk drive, so that the hard disk drive is inserted into the hard disk drive bracket in a preset direction.

In an embodiment of the present disclosure, the fixation rack and/or the rotation rack contain at least one buffer protrusion.

The present application further provides an electronic device, including a tool-less assembly hard disk drive bracket, the tool-less assembly hard disk drive bracket includes a fixation rack, a rotation rack, and at least two connecting components. The fixation rack includes a fixation bracket portion and a fixation arm connected with a first side of the fixation bracket portion. The rotation rack includes a rotation arm connected with a second side of the fixation bracket portion, and a rotation bracket portion connected with the rotation arm. The rotation bracket portion is connected with the fixation bracket portion, and the rotation bracket portion and fixation bracket portion support a hard disk drive. At least two connecting components are arranged on an inner side of the fixation arm and an inner side of the rotation arm, respectively. The connecting components connect and fix the hard disk drive in the structure formed by the fixation rack and the rotation rack.

As mentioned above, the tool-less assembly hard disk drive bracket and the electronic device of the present disclosure have the following beneficial effects:

The hard disk drive bracket includes the rotation rack. The rotation bracket portion is connected with the rotation arm of the rotation rack. The rotation bracket portion is connected with the fixation bracket portion to support the hard disk drive together, thereby realizing the disassembly and assembly of the hard disk drive. The hard disk drive is fixed through the snap structure, so as to realize the tool-less assembly. The present disclosure is simple in installation, convenient in assembly and disassembly, and easy to maintain, thereby having high economy and practicability.

DESCRIPTION OF REFERENCE NUMERALS

Figure 1:
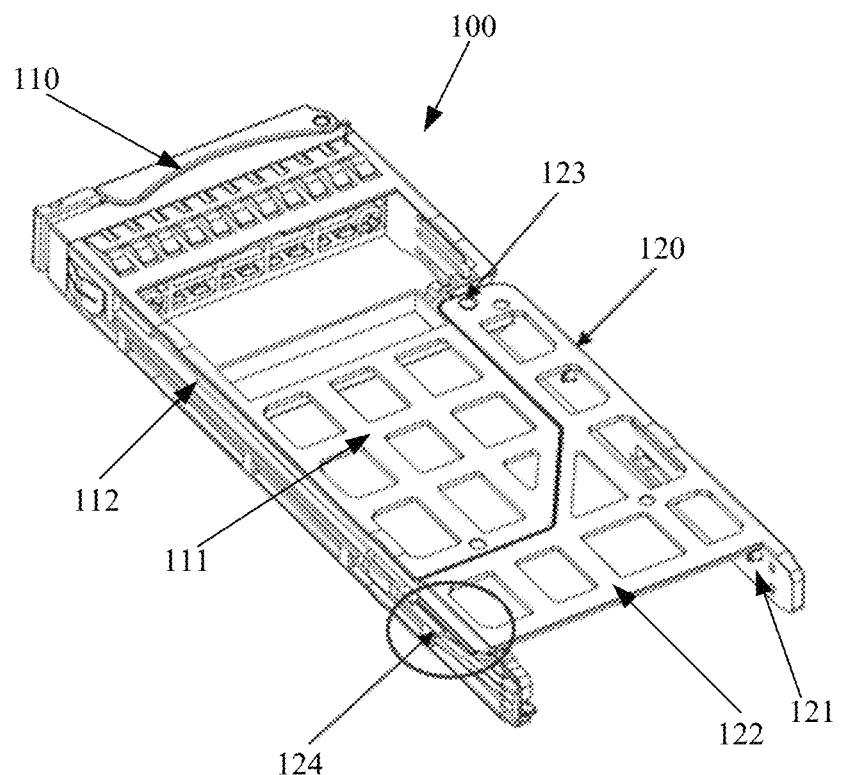
FIG. 1 shows a schematic diagram of a tool-less assembly hard disk drive bracket according to the present disclosure.

100 Tool-less assembly hard disk drive bracket
110 Fixation rack
111 Fixation bracket portion
112 Fixation arm
112a Indentation
120 Rotation rack
121 Rotation arm
122 Rotation bracket portion
122a Longitudinal rotation bracket portion
122b Lateral rotation bracket portion
123 Rotation shaft
124 Snap structure
130 Connecting component
140 Buffer protrusion
150 Fool-proofing block
200 Hard disk drive

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different specific implementation modes. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

The present disclosure provides a tool-less assembly hard disk drive bracket and an electronic device to solve the problem that it is inconvenient and time-consuming to assemble or disassemble hard disk drive cartridge, and it is easy to damage the hard disk drive when inserting and removing the hard disk drive for many times.

The following will explain the tool-less assembly hard disk drive bracket and the electronic device according to the present disclosure in detail, so that those skilled in the art can understand the present disclosure without creative work.

Referring to FIGS. 1 to 9, which are schematic diagrams of a tool-less assembly hard disk drive bracket and an electronic device according to the present disclosure.

As shown in FIG. 1, in this embodiment, the tool-less assembly hard disk drive bracket 100 includes: a fixation rack 110, a rotation rack 120, and at least two connecting components 130.

Figure 3:
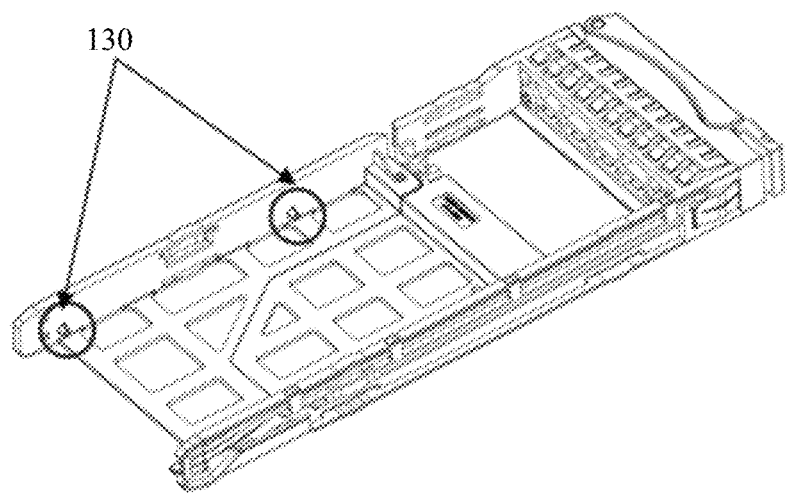
FIG. 3 shows a schematic diagram of the connection component in a tool-less assembly hard disk drive bracket according to the present disclosure.
Figure 4:
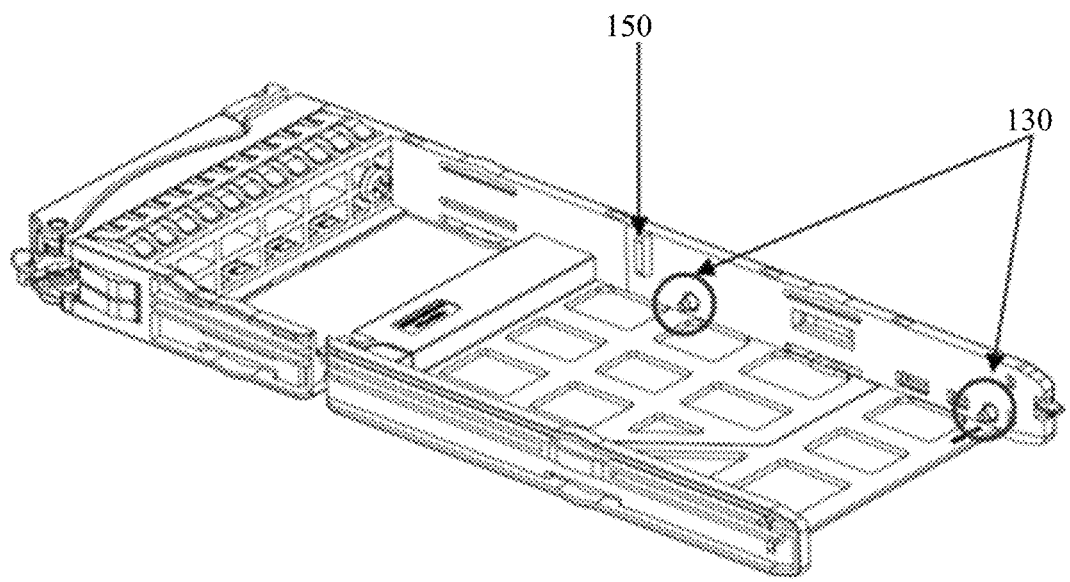
FIG. 4 shows a schematic diagram of the fool-proofing block in a tool-less assembly hard disk drive bracket according to the present disclosure.

The fixation rack 110 includes a fixation bracket portion 111 and a fixation arm 112 connected with the first side of the fixation bracket portion 111. The rotation rack 120 includes a rotation arm 121 connected with the second side of the fixation bracket portion 111, and a rotation bracket portion 122 connected with the rotation arm 121. The rotation bracket portion 122 is capable of connecting with the fixation bracket portion 110, so as to support the bottom of the hard disk drive. As shown in FIGS. 3 to 4, the at least two connecting components 130 are respectively arranged on the inner side of the fixation arm 112 and the inner side of the rotation arm 121, for connecting and fixing the hard disk drive installed in the structure formed by the fixation rack 110 and the rotation rack 120.

The fixation rack 110, the rotation rack 120, and the connecting component 130 in this embodiment are described in detail below.

In this embodiment, as shown in FIG. 1, the fixation rack 110 has the fixation bracket portion 111 and the fixation arm 112 connected with the first side of the fixation bracket portion 111. The fixation bracket portion 111 has a handle-type connecting portion at the top for connecting with an external electronic device.

Figure 2:
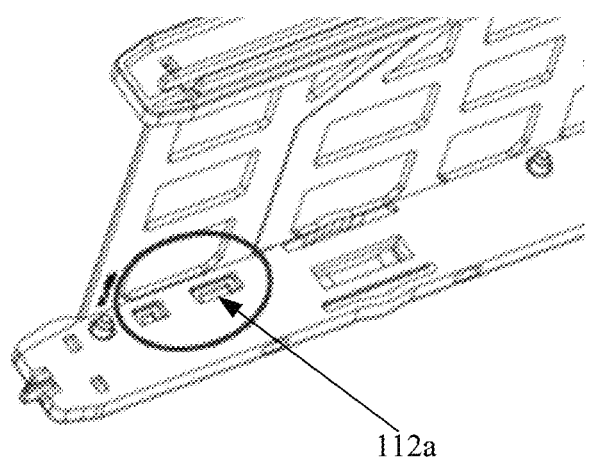
FIG. 2 shows a schematic diagram of the indentation in a tool-less assembly hard disk drive bracket according to the present disclosure.

An auxiliary structure such as a slide rail may be contained on the outer side of the fixation arm 112 for connecting the fixation rack 110 with the external electronic device. In addition, in this embodiment, as shown in FIG. 2, the fixation arm 112 has a structure such as an indentation 112a for connecting and fixing the rotation rack 120.

In this embodiment, the fixation bracket portion 111 is a part of the bottom of the hard disk drive bracket, the fixation bracket portion 111 together with the rotation bracket portion 122 forms the whole bottom of the bracket together. This will be further explained later.

In this embodiment, as shown in FIG. 1, the rotation rack 120 includes a rotation arm 121 and a rotation bracket portion 122.

The fixation arm 112 is connected with the first side of the fixation bracket portion 111. The rotation arm 121 is connected with the second side of the fixation bracket portion 111. The rotation bracket portion 122 is connected with the rotation arm 121. The rotation bracket portion 122 is connected with the fixation bracket portion 110 to support the bottom of the hard disk drive together. That is, the rotation bracket portion 122 is a part of the bottom of the bracket, and is capable of supporting the hard disk drive when the hard disk drive is installed.

When the rotation bracket portion 122 is engaged with the fixation arm 112, the rotation bracket portion 122 and the fixation bracket portion 111 form the entire bottom of bracket that supports the hard disk drive.

In this embodiment, the rotation bracket portion and the fixation bracket portion are engaged or disengaged from each other through a snap structure.

In this embodiment, the rotation bracket portion 122 and the fixation bracket portion 111 form a rectangle matching the bottom of the hard disk drive. The rotation bracket portion 122 and the fixation bracket portion 111 have a heat dissipation hole or a hollow structure with a predetermined pattern.

In this embodiment, the rotation arm 121 and the rotation bracket portion 122 are preferably integrally formed. Other fixation or connection methods such as welding or rivets also may be adopted.

Figure 5:
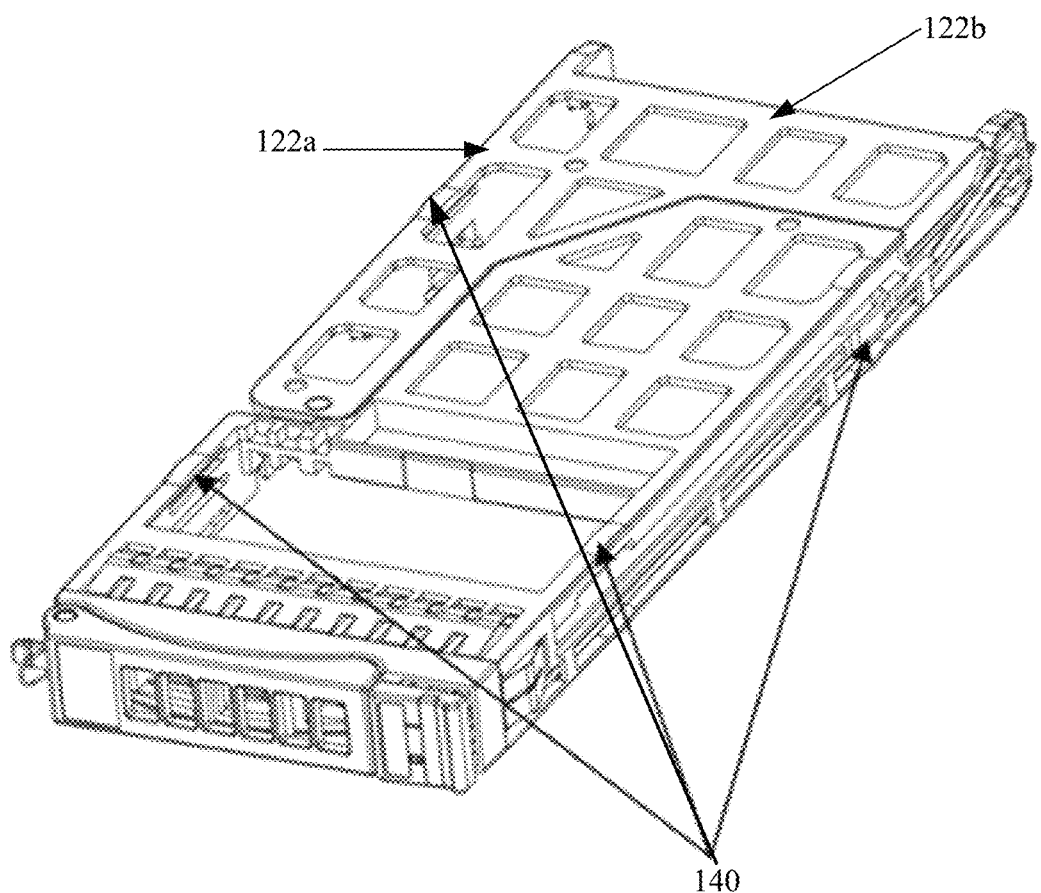
FIG. 5 shows a schematic diagram of the buffering protrusion in a tool-less assembly hard disk drive bracket according to the present disclosure.
Figure 6:
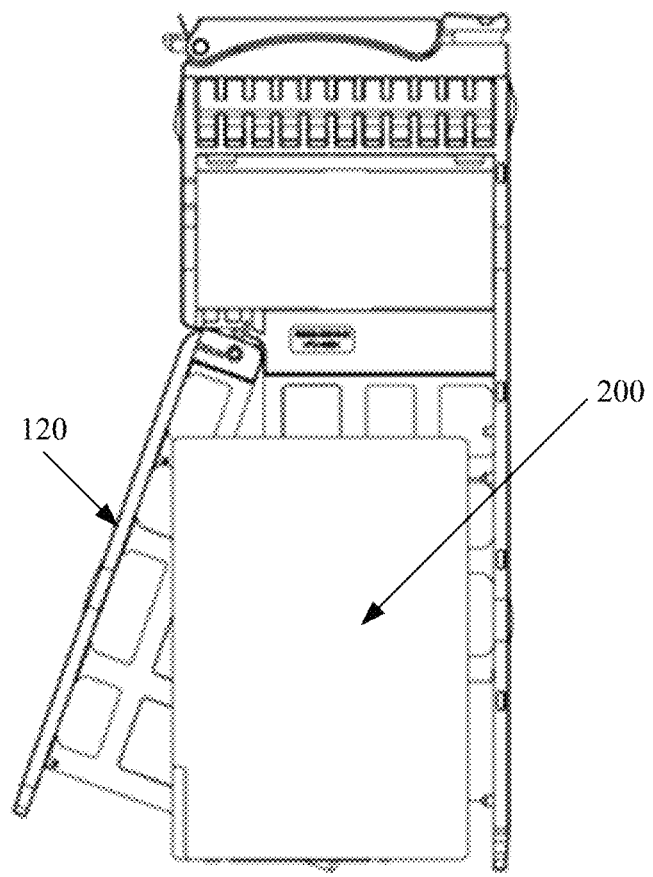
FIGS. 6 to 9 show the processes for installing HDD using a tool-less assembly hard disk drive bracket according to the present disclosure.
Figure 7:
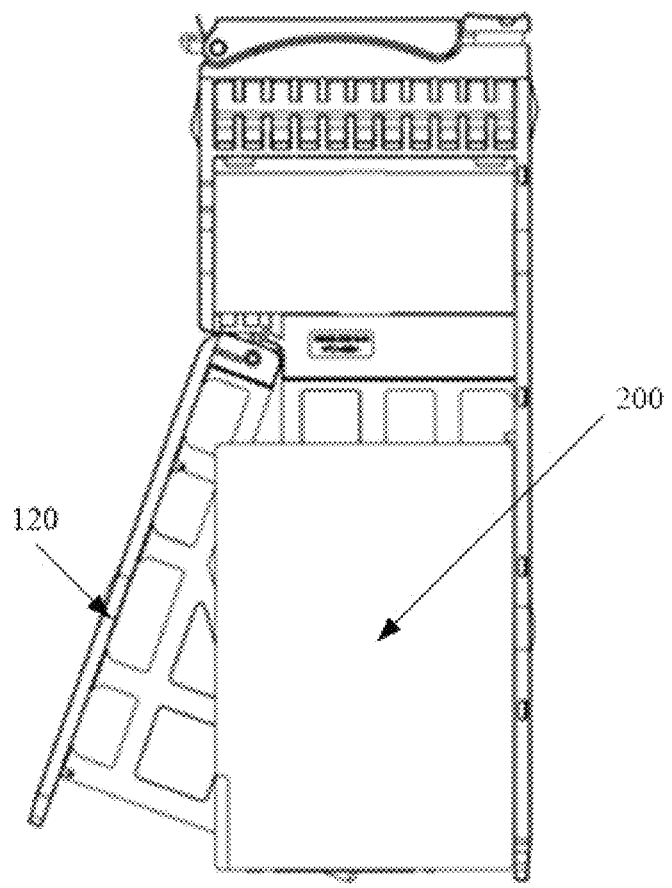
Figure 8:
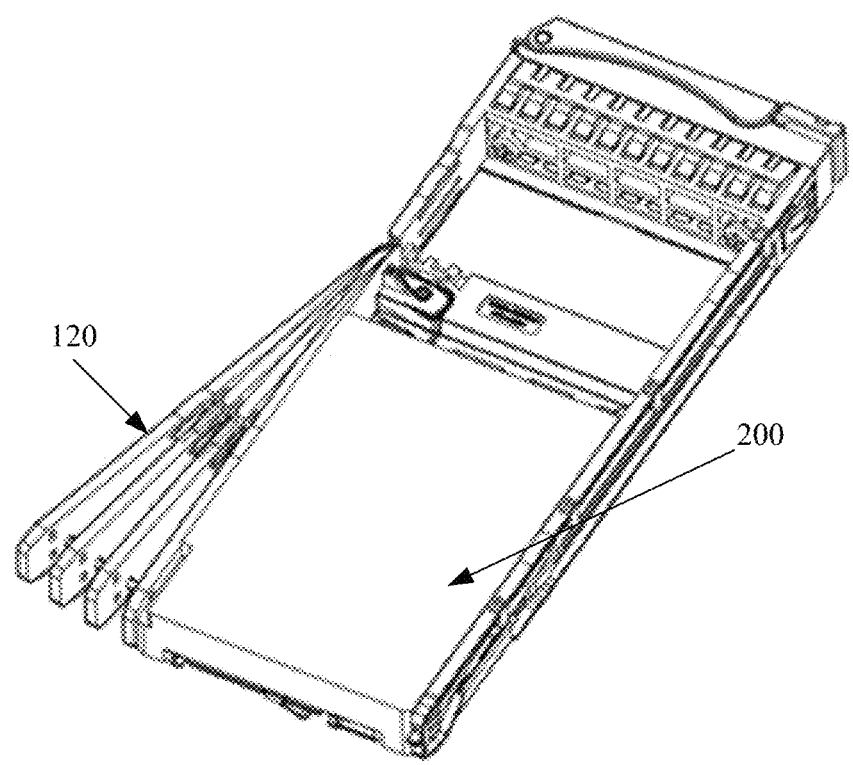
Figure 9:
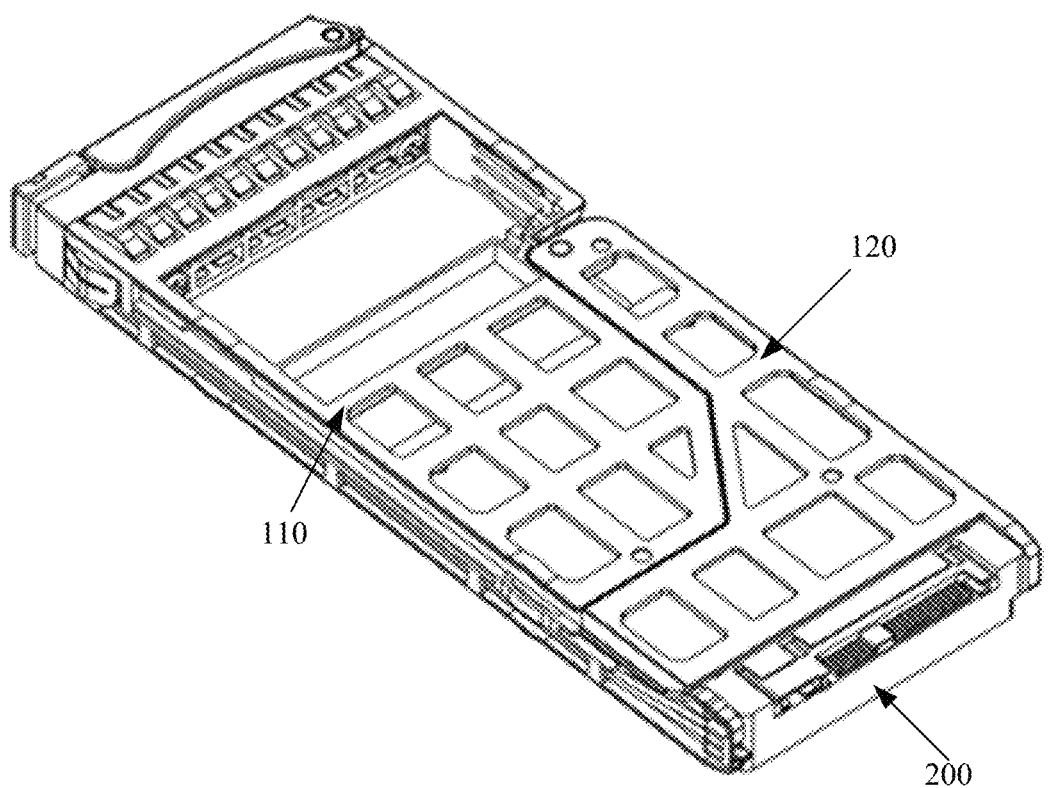

Specifically, in this embodiment, as shown in FIG. 5, the rotation bracket portion 122 includes a longitudinal rotation bracket portion 122 parallel to the rotation arm 121, and a lateral rotation bracket portion 122b perpendicular to the longitudinal rotation bracket portion 122a.

In this embodiment, the top end of the longitudinal rotation bracket portion 122 is connected with the fixation rack 110 through a rotation shaft 123, so that the rotation bracket portion 122 can rotate relative to the fixation rack 110 and drive the rotation arm 121 to rotate. The top end of the lateral rotation bracket portion 122b can be engaged with or disengaged from the fixation arm 112 through a snap structure 124.

In this embodiment, the fixation arm 112 has at least one indentation 112a, and the snap structure 124 of the lateral rotation bracket portion 122b is matched with the indentation 112a, so that the lateral rotation bracket portion 122b is engaged with or disengaged from the fixation arm 112.

When inserting a hard disk drive in the tool-less assembly hard disk drive bracket 100, the rotation bracket portion 122 is detached from the fixation arm 112, the rotation arm 121 and the rotation bracket portion 122 are rotated outward, and the hard disk drive can be placed in the fixation bracket portion 111. The hard disk drive is assembled with the clamping posts on the fixation arm 112 to realize the fixation on one side. Subsequently, the rotation arm 121 and the rotation bracket portion 122 are controlled to approach the hard disk drive. The hard disk drive is assembled with the clamping post on the rotation arm 121 while the rotation arm 121 rotates, until the rotation bracket portion 122 is engaged with the fixation arm 112. At this time, the rotation arm 121 and the fixation arm 112 lock the hard disk drive. Assembly of tool-less assembly hard disk drive bracket 100 with hard disk drive is completed.

When removing the hard disk drive 200 from the tool-less assembly hard disk drive bracket 100, the rotation bracket portion 122 is detached from the fixation arm 112, the rotation arm 121 and the rotation bracket portion 122 are rotated outward, the clamping post on the rotation arm 121 is released from the hard disk drive, gently pulling the hard disk drive, the clamping post on the fixation arm 112 is detached from the hard disk drive, and the hard disk drive is removed from the tool-less assembly hard disk drive bracket 100.

As shown in FIG. 3 and FIG. 4, in this embodiment, at least two connecting components 130 are respectively installed on the inner side of the fixation arm 112 and the inner side of the rotation arm 121 for connecting and fixing the hard disk drive in the structure formed by the fixation rack 110 and the rotation rack 120.

In this embodiment, as shown in FIG. 3 and FIG. 4, the connecting component 130 is a clamping post. The clamping post is matched with the connection hole of the hard disk drive for fixing the hard disk drive.

The fixation arm 112 includes at least one clamping post, and the rotation arm 121 includes at least one clamping post. The number and position of the clamping posts on the fixation arm 112 and the rotation arm 121 are the same as the number and position of the connection holes on the hard drive correspond.

For example, the hard disk drive has two connection holes in each side, respectively. That is, the hard disk drive has four connection holes. As shown in FIG. 3, the hard disk drive bracket has four clamping posts correspondingly, i.e. the fixation arm 112 has two clamping posts, and the rotation arm 121 has two clamping posts.

The clamping post is preferably a plastic clamping post. Other lightweight materials also may be selected as the material the clamping post.

In this embodiment, as shown in FIG. 4, the fixation arm 112 has a fool-proofing block 150. The fool-proofing block 150 is matched with the hard disk drive so that the hard disk drive is inserted into the hard disk drive bracket in a preset direction, preventing the hard disk drive from being inserted in a wrong direction.

As shown in FIG. 5, the fixation rack 110 and/or the rotation rack 120 have at least one buffer protrusion 140. For example, the fixation arm 112 has two spaced buffer protrusions at the top end, the rotation arm 121 has one buffer protrusion 140 at the top end, and handle-type connection portion has one buffer protrusion 140. The position and number of the buffer protrusions 140 may be set according to actual needs. It is not specifically limited in this embodiment.

In this embodiment, the fixation rack 110 and/or the rotation rack 120 have buffer protrusions 140 in each direction, for buffering (absorbing tolerances) when assembling the tool-less assembly hard disk drive bracket 100 with hard disk drive and assembling the tool-less assembly hard disk drive bracket 100 with the external electronic device.

The present disclosure further provides an electronic device, including the above tool-less assembly hard disk drive bracket 100. The electronic device may be a chassis, a server, a computer storage device, or the like.

The using process of the tool-less assembly hard disk drive bracket 100 is as follows.

As shown in FIGS. 6 to 9, when inserting a hard disk drive 200 in the tool-less assembly hard disk drive bracket 100, detaching the snap structure 124 from the indentation 112a of the fixation arm 112, so that the rotation bracket portion 122 is detached from the rotation arm 121.

Then the rotation bracket portion 122 rotates around the rotation shaft 123, the rotation arm 121 and the rotation bracket portion 122 rotate relative to the fixation rack 110, so that the rotation arm 121 and the rotation bracket portion 122 rotate outward. At this time, the hard disk drive 200 can be placed in the fixation bracket portion 111. Part of the hard disk drive 200 is placed in the rotation bracket portion 122, so that the hard disk drive 200 is assembled with the clamping post on the fixation arm 112, realizing the fixation of the hard disk drive 200 on one side.

After that, the rotation arm 121 and the rotation bracket portion 122 are controlled to approach the hard disk drive 200. The hard disk drive 200 is assembled with the clamping post on the rotation arm 121 while the rotation arm 121 rotates, until the rotation bracket portion 122 is engaged with the fixation arm 112. At this time, the rotation bracket portion 122 and the fixation bracket portion 111 form the entire bottom of the bracket, which supports the hard disk drive 200. The rotation arm 121 and the fixation arm 112 lock the hard disk drive. Assembly of tool-less assembly hard disk drive bracket 100 with the hard disk drive 200 is completed.

When removing the hard disk drive 200 from the tool-less assembly hard disk drive bracket 100, the rotation bracket portion 122 is detached from the fixation arm 112, the rotation bracket portion 122 rotates around the rotation shaft 123, the rotation arm 121 and the rotation bracket portion 122 rotate relative to the fixation rack 110, so that the rotation arm 121 and the rotation bracket portion 122 are rotated outward, the clamping post on the rotation arm 121 is released from the hard disk drive 200, the hard disk drive 200 has more space for moving, then gently pulling the hard disk drive 200, the clamping post on the fixation arm 112 is detached from the hard disk drive 200, and the hard disk drive 200 is removed from the tool-less assembly hard disk drive bracket 100.

In summary, in the present disclosure, the hard disk drive bracket includes the rotation rack. The rotation bracket portion is connected with the rotation arm of the rotation rack, and the rotation bracket portion is connected with the fixation bracket portion to support the hard disk drive together. The hard disk drive is fixed through the snap structure, so as to realize the tool-less assembly. The present disclosure is simple in installation, convenient in assembly and disassembly, and easy to maintain, thereby having high economy and practicability. Therefore, the present disclosure effectively overcomes various shortcomings and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A tool-less assembly hard disk drive bracket, comprising:
   a fixation rack, including a fixation bracket portion and a fixation arm connected with a first side of the fixation bracket portion;
   a rotation rack, including:
      a rotation arm connected with a second side of the fixation bracket portion, and
      a rotation bracket portion connected with the rotation arm, wherein
         the rotation bracket portion is removably connected with the fixation bracket portion, and the rotation bracket portion and fixation bracket portion are coplanar and form a rectangle matching and supporting a bottom of the hard disk drive,
         the rectangle is parallel to the bottom of the hard disk drive, and
         the rotation bracket portion is capable of rotating around an axis perpendicular to the rectangle, wherein the rotation bracket portion is connected with the fixation rack through a rotation shaft; and
   at least two connecting components, arranged on an inner side of the fixation arm and an inner side of the rotation arm, respectively, wherein the connecting components connect and fix the hard disk drive in a structure formed by the fixation rack and the rotation rack.

2. The tool-less assembly hard disk drive bracket according to claim 1, wherein the rotation arm and the rotation bracket portion are integrally formed.

3. The tool-less assembly hard disk drive bracket according to claim 1, wherein the rotation bracket portion and the fixation bracket portion are engaged with or disengaged from each other through a snap structure.

4. The tool-less assembly hard disk drive bracket according to claim 3, wherein the rotation bracket part and the fixation bracket part include a heat dissipation hole or a hollow structure with a preset pattern.

5. The tool-less assembly hard disk drive bracket according to claim 1, wherein the rotation bracket portion includes a longitudinal rotation bracket portion parallel to the rotation arm, and a lateral rotation bracket portion vertical to the longitudinal rotation bracket portion.

6. The tool-less assembly hard disk drive bracket according to claim 5, wherein a top end of the longitudinal rotation bracket portion is connected with the fixation rack through a rotation shaft, so that the rotation bracket portion is capable of rotating relative to the fixation rack, and driving the rotation arm to rotate.

7. The tool-less assembly hard disk drive bracket according to claim 5, wherein a top end of the lateral rotation bracket portion is engaged with or disengaged from the fixation arm through a snap structure.

8. The tool-less assembly hard disk drive bracket according to claim 7, wherein the fixation arm includes at least one indentation, and the snap structure of the lateral rotation bracket portion matches the indentation, so that the lateral rotation bracket portion is engaged with or disengaged from the fixation arm.

9. The tool-less assembly hard disk drive bracket according to claim 1, wherein the fixation arm includes at least one indentation, and the snap structure of the lateral rotation bracket portion matches the indentation, so that the lateral rotation bracket portion is engaged with or disengaged from the fixation arm.

10. The tool-less assembly hard disk drive bracket according to claim 1, wherein the connecting component includes a clamping post, the clamping post matches a connecting hole of the hard disk drive to fix the hard disk drive.

11. The tool-less assembly hard disk drive bracket according to claim 1, wherein the fixation arm contains a fool-proofing block; the fool-proofing block matches the hard disk drive, so that the hard disk drive is inserted into the hard disk drive bracket in a preset direction.

12. The tool-less assembly hard disk drive bracket according to claim 1, wherein the fixation rack and/or the rotation rack contain at least one buffer protrusion.

13. An electronic device, comprising a tool-less assembly hard disk drive bracket, wherein the tool-less assembly hard disk drive bracket comprises:
   a fixation rack, including a fixation bracket portion and a fixation arm connected with a first side of the fixation bracket portion;
   a rotation rack, including:
      a rotation arm connected with a second side of the fixation bracket portion, and
      a rotation bracket portion connected with the rotation arm, wherein
         the rotation bracket portion is removably connected with the fixation bracket portion, and the rotation bracket portion and fixation bracket portion are coplanar and form a rectangle matching and supporting a bottom of the hard disk drive,
the rectangle is parallel to the bottom of the hard disk drive, and
the rotation bracket portion is capable of rotating around an axis perpendicular to the rectangle, wherein the rotation bracket portion is connected with the fixation rack through a rotation shaft; and
at least two connecting components, arranged on an inner side of the fixation arm and an inner side of the rotation arm, respectively, wherein
the connecting components connect and fix the hard disk drive in a structure formed by the fixation rack and the rotation rack.

* * * * *